Aug. 18, 1964 T. H. COLE 3,144,889

TRANSISTOR PREPARATION MACHINE

Filed July 24, 1961 5 Sheets-Sheet 1

INVENTOR
THEODORE H. COLE

BY Donald R. Campbell
ATTORNEY

Aug. 18, 1964 T. H. COLE 3,144,889

TRANSISTOR PREPARATION MACHINE

Filed July 24, 1961 5 Sheets-Sheet 2

United States Patent Office 3,144,889 Patented Aug. 18, 1964

3,144,889

TRANSISTOR PREPARATION MACHINE

Theodore H. Cole, Union Center, N.Y., assignor to International Business Machines Corporation, New York, N.Y., a corporation of New York Filed July 24, 1961, Ser. No. 126,232
11 Claims. (Cl. 140—140)

The present invention relates to a transistor or component preparation machine and, more particularly, to a machine for automatically straightening and cutting off the leads of a transistor as received from the manufacturer.

In its preferred embodiment this machine operates upon transistors of the ordinary type having three leads in a triangular configuration extending from the base of the can or envelope. As received from the manufacturer, the leads are relatively long and at random angles to the base of the can and are often curved or bent. In order to mount the transistors on cards having holes through which the leads extend, it is necessary to cut off the leads to a relatively short length and to straighten the leads approximately perpendicular to the can so that they are aligned and are insertable into the previously made holes in the card.

Accordingly, an object of the invention is to provide a new and improved transistor lead straightening and cutoff machine.

Another object of the invention is to provide a new and improved transistor preparation machine for straightening the leads of the transistor substantially perpendicular to the base of the can and for cutting off the leads to the desired length.

Yet another object of the invention is to provide a new and improved transistor lead straightening and cutoff machine designed to operate continuously and automatically if desired, or to operate on a magazine full of transistors before being indexed to operate on another magazine.

A further object is the provision of a new and improved transistor preparation machine for straightening and trimming the leads to length without causing appreciable damage to the leads or the can or other parts of the transistor.

A still further object is to provide a preparation machine of the foregoing type which is applicable to straightening and trimming the leads of components other than transistors having generally a plurality of leads extending from one end of a body member.

The transistor or component preparation machine according to the invention utilizes gravity feed to convey each transistor through a pre-straightening station and a final straightening and cutoff station. The transistors slide down a track having separated cover plates through which the leads extend. In the pre-straightening station the transistor can is pushed against the track cover plates by a plunger and is restrained laterally by two grippers advancing from either side. The leads are engaged and combed forwardly a short distance. In the final straightening and cutoff station, the transistor again is held against the track cover plates by a plunger and restrained laterally by two grippers. Then opposing punches advance from either side and tightly grip the leads as a cutter blade trims them to length. An electrical circuit is provided to assure automatic operation of the machine. Loaded and empty magazines may be mounted at either end of the track on a rotatable indexing mechanism to be rotated into place during the operation of the machine.

The foregoing and other objects, features and advantages of the invention will be apparent from the following more particular description of a preferred embodiment of the invention, as illustrated in the accompanying drawings, wherein.

Figure 1:
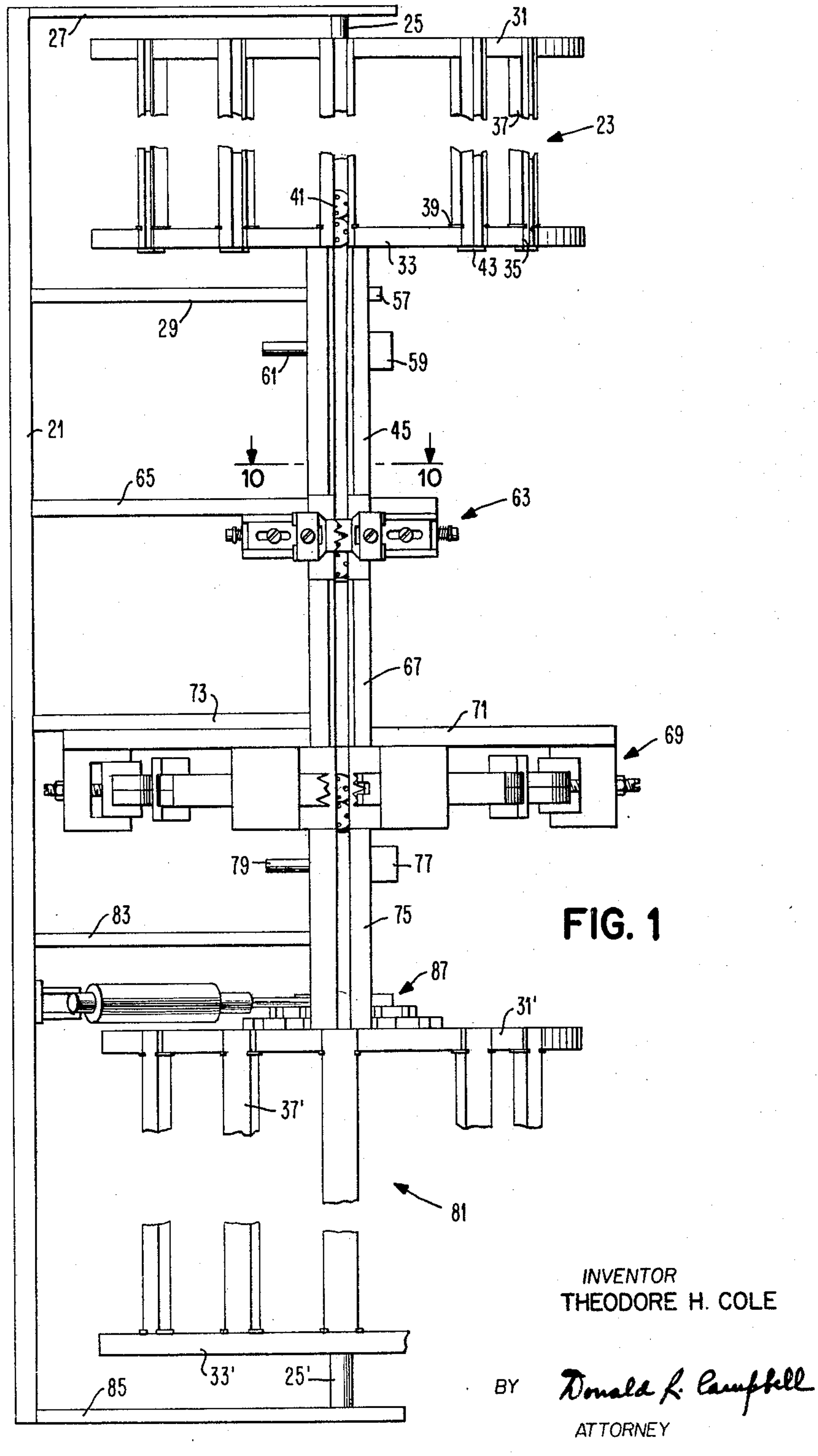
FIG. 1 is an elevation view of the transistor preparation machine, parts being broken away and shown diagrammatically.

The transistor or component preparation machine for straightening and trimming to length the leads of a transistor or similar type of component is desirably mounted upon a vertical support 21 illustrated diagrammatically in FIG. 1 which is secured in any convenient manner to a wall or a base not here shown. A description of the general organization of the machine will be given before proceeding to a detailed examination of the various component parts. Although the machine performs upon various electrical components generally having a plurality of leads extending from one end of a body member, the preferred embodiment of the machine operates upon transistors having three leads.

The machine operates by gravity feed and has at the top a supply and storage device indicated generally at 23 for storing transistors and feeding them in a continuous supply or by batches. The exact structure of the supply and storage device 23 is not material to the invention, but in the preferred embodiment includes a shaft 25 journaled for rotation at either end in a pair of vertically spaced braces 27 and 29 extending laterally from the vertical support 21. Secured to the shaft 25 are a pair of spaced discs 31 and 33 each having a plurality of circumferentially spaced peripheral notches 35. A transistor magazine 37 is received removably in aligned notches in the two discs 31 and 33 and is conveniently held in place as by spring clips 39. One or more of the supply magazines 37 is loaded with transistors 41 as received from the manufacturer. A suitable arrangement such as a sliding latch 43 prevents the transistors from falling out of the bottom of the magazines 37.

The supply and storage device or magazine holder 23 may be indexed manually to align a particular one of the magazines 37 with the top of a vertical track section 45. As shown in greater detail in FIG. 10, the track section 45 includes a channel-like body member defining a U-shaped cavity 47 to receive the can or envelope 49 of each of the transistors 41. A pair of cover plates 51 and 53 are secured to the open side of the channel and extend partially across the front of the cavity 47 to leave a space through which the leads 55 of the transistor extend. The transistor is the ordinary type having three leads 55 arranged in a triangular configuration extending from the base or header of the can 49, it being understood that the three leads 55 have a lead circle which is within the prescribed nationally accepted tolerances. The track cover plates 51 and 53 are so arranged that two leads lie against one of the cover plates while only one lead lies against the other cover plate. The transistors are loaded into the supply magazines 37 with the same lead orientation so that the machine operates upon a uniformly oriented supply.

The upper track section 45 is conveniently mounted in a recess in the lateral brace 29 and held in place by a set screw 57 tightened against the side of the channel. A break in the supply of transistors is detected by a photocell 59 energized by a lamp source 61.

The upper track section 45 delivers transistors to a pre-straightening station indicated here generally at 63. This station is mounted upon a horizontal brace 65 secured to the vertical support 21. The pre-straightening station will be described in greater detail later and broadly holds the transistor against the track cover plates while gripping it lightly from either side and combing forwardly on the leads for a short distance to provide a pre-straightening action. The transistors with partially straightened leads then drop into an intermediate track section 67 similar to the track section 45 previously described.

The transistors next are operated upon by a straightening and cutoff station indicated generally at 69. This station is fastened to the underside of a base plate 71 which is in turn secured to a horizontal brace 73 fixed to the vertical support 21. In the straightening and cutoff station, the transistors are again pushed forwardly against the track cover plates and gripped lightly from either side. The leads are more accurately straightened by being engaged by a pair of overlapping punches advancing from either side and are then trimmed to length by a shear punch. The transistors drop into a lower track section 75 similar to the other tracks. The intermediate track section 67 and the lower track section 75 are conveniently secured to supporting members of the straightening and cutoff stations 69. A photocell 77 energized by a lamp source 79 may be provided on the lower track section 75 to count off the finished transistors.

Figure 11:
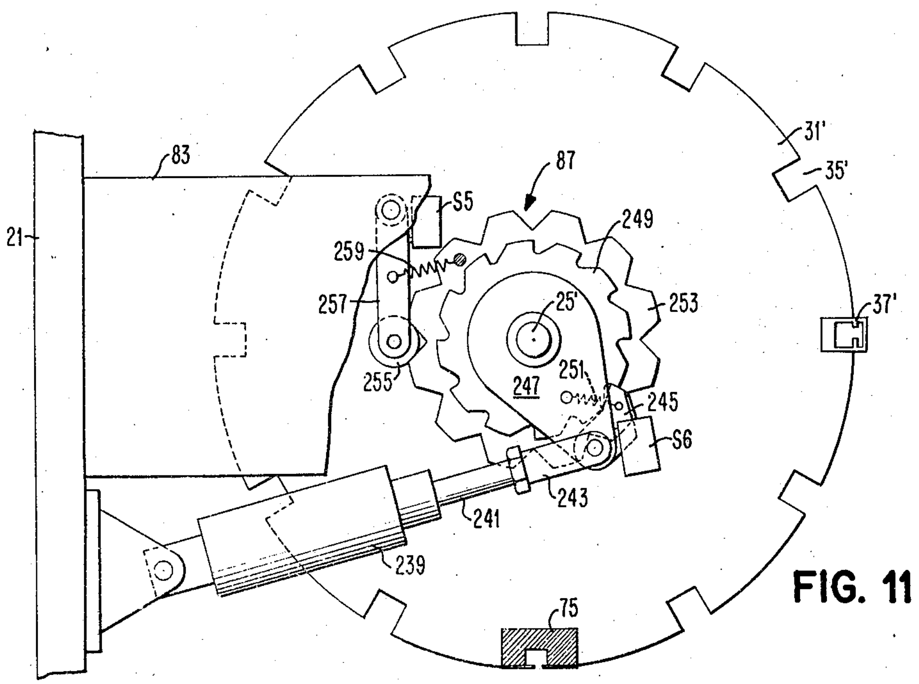
FIG. 11 is a plan view looking downwardly on the indexing mechanism for the magazine holders, which is illustrated also in FIG. 1 in a side elevational view.

An empty magazine holder or receiver device indicated generally at 81 is provided at the lower end of the machine. The empty magazine holder 81 is similar to the supply and storage device 23 and like parts in the two devices are indicated by corresponding respectively unprimed and primed numerals. Thus a shaft 25' is journaled for rotation on a pair of vertically spaced braces 83 and 85, rotatable discs 31' and 33' being secured to the shaft 25' with the magazines 37' between them. In the preferred embodiment the magazines 37' are indexed into alignment with the lower track section 75 by means of an automatic indexing mechanism indicated generally at 87. The magazines 37 and 37' may not be identical, since the upper magazine 37 preferably is essentially U-shaped and the magazine 37' takes the form shown in FIG. 11.

The pre-straightening station 63 is illustrated in FIGS. 2 to 5 and will be now described in greater detail. This station is carried by a top mounting plate 89 (FIG. 4) which is fastened to the underside of the horizontal brace member 65. The top mounting plate 89 has a rear downwardly extending arm or lug 91 on which is supported an air cylinder 93 having conventional connections to a source of air not here shown. The shaft 95 of the air cylinder extends forwardly through a bearing 97 in a centrally located downwardly extending lug 99 on the top plate 89. The forward portion of the shaft 95 has a cam surface 101, and the diametrically reduced front end has an axially extending bore 103 in which is received a plunger pin 105. The plunger 105 is urged outwardly by a spring 107, motion in an axial direction being limited by a pin 147 engaged in a longitudinally extending recess in the periphery of the plunger (see FIG. 3).

Figure 5:
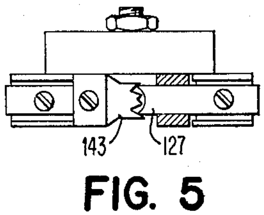
FIG. 5 is a front end view of the pre-straightening station with the mechanism closed, parts being eliminated and drawn in section.
Figure 6:
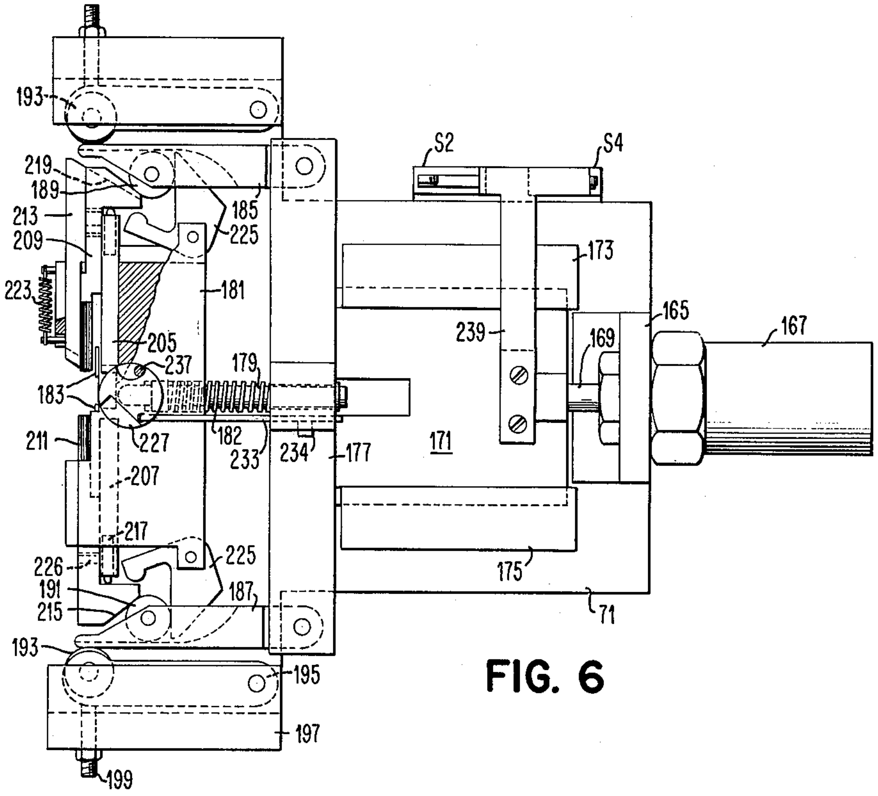
FIG. 6 is a plan view, looking upwardly, of the final straightening and cutoff station with the parts in open position.
Figure 8:
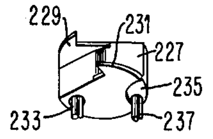
FIG. 8 is a perspective view of the rotary escapement shown in FIG. 6.

A bottom plate 109 is secured to the lug 99 extending forwardly approximately parallel to the top mounting plate 89. A pair of opposing lever arms 111 and 113 are disposed between the two plates 89 and 109 and pivoted for movement about pivot pins 115 and 117, respectively. Each cam lever 111 and 113 has a roller 119 mounted at its inner rear end which is in engagement with the shaft 95. At the front inner ends of the cam levers are another set of rollers 121, one roller on each lever. The outer longitudinal edge of the cam lever 111 is recessed and a gripper arm 123 is mounted in the recess and pivoted near its rear end at 125. To the front end of the gripper arm 123 is secured a laterally extending gripper 127 having an arcuate end (FIG. 5). The gripper 127 is mounted resiliently in a horizontal direction and for this purpose a stud 129 extends through a smooth bore in the gripper arm 123 into threaded engagement with the cam lever 111. A spring surrounds the outer portion of the stud 129 and acts between the head of the stud and the side of the gripper arm 123. In similar fashion, a gripper arm 131 is pivoted to the cam lever 113 and has a laterally extending gripper 133 secured to its front end. By this arrangement the advancing shaft 95 cams the lever arms 111 and 113 inwardly when the rollers engage the cam surface 101 on the shaft. Thus the grippers 127 and 133 advance toward one another until engaging the sides of a transistor located in the portion of the track 45 extending through the pre-straightening section. At about the same time, the plunger 105 engages the rear of the can 49 of the transistor, urging its header or base against the cover plates 51 and 53 of the track.

Also disposed between the plates 89 and 109 is a yoke member 135 having a longitudinal central bore through which the shaft 95 is slidable. A pair of blade arms 137 and 139 are pivoted to the yoke 135 on opposite sides of the shaft 95 and respectively carry inwardly extending straightening punches 141 and 143 at their forward ends. As is eivdent in FIGS. 5 and 1, each punch has three V-shaped notches adapted to move into near engagement with the three transistor leads 55 mounted in a triangular configuration. When closed together, the W punches slide upon one another and form openings about each of the transistor leads 55 which are slightly larger than the diameter of the leads. The sides of the blade arms 137 and 139 engage and are slidable on the rollers 121 on the cam levers 111 and 113. A spring 145 abuts the yoke 135 at one end and extends into a bore in the gripper arm 139 to urge the arm into engagement with the roller 121. In similar fashion, the gripper arm 137 is urged outwardly into engagement with the roller 121 on the cam lever 111.

As the shaft 95 advances, it can be readily seen that the pivoting of the cam levers 111 and 113 serves to close both the grippers 127 and 133 and also the straightening W-punches 141 and 143. The front end of the shaft 95 carries a downwardly extending pin 147 which extends through an elongated slot 149 in the yoke 135 and an aligned slot 151 in the bottom plate 109. The yoke member 135 has two positions represented by the engagement of a spring urged ball detent 153 in either of two arcuate notches 155 in the top of the yoke 135. Upon retraction of the shaft 95, the pin 147 engages the rear end of the slot 149 and pulls the yoke 135 rearwardly until engaging the rear end of the slot 151. The ball detent 153 is thus retracted and falls into the forwardmost one of the notches 155. Upon forward movement of the shaft 95, on the other hand, the pin 147 strikes the forward end of the slot 149 and carries the yoke member forwardly until the pin 147 engages the front end of the slot 151, the ball detent 153 being urged into the rearwardmost one of the notches 155. The result of this action is that after the straightening punches 141 and 143 are closed, the pin 147 engages the yoke 135 to urge it forwardly a short distance, thus also moving forward the closed punches 141 and 143 which comb the transistor leads 55 for a short distance. In the machine being described, this distance is approximately one quarter inch. Upon the retraction of the shaft 95, the pin 147 must travel the full length of the slot 149 before pulling back on the yoke 135, and before this occurs the rollers 119 slide down the cam 101 thereby urging the grippers 127 and 133 and the straightening punches 141 and 143 apart to their open positions. It is seen that the yoke 135 and the straightening punches are retracted ready for the next operation on the next transistor.

A switch mounting plate 157 is mounted on the bottom plate 109 beneath the lug 99 and extends rearwardly parallel to the top mounting plate 89. The mounting plate 157 has a rearwardly opening central recess 159 to either side of which are mounted a pair of microswitches S1 and S3. The microswitches have actuating arms which extend over the recess 159 to be engageable by a downwardly extending lug 160 secured to and movable with the shaft 95. Thus upon movement of the shaft 95 forwardly, the lug 160 engages and closes the microswitch S3, and upon retraction the lug 160 engages and closes the microswitch S1. These switches are connected in a suitable manner with the air cylinder 93 to cause the alternate continuous forward movement and retraction of the shaft 95. A meter or stop plate 161 is pivoted to the bottom of the bottom plate 109 and has a forward end extending through a slot in the portion of the track in the pre-straightening station between the track sections 45 and 67. A spring 163 urges the rear portion of the meter into engagement with the pin 147 on the shaft 95. In the retracted position of the shaft, the meter plate 161 is disposed within the track and limits the downward movement of the transistors above it. As the shaft 95 moves forwardly, the pin 147 engages a slanted intermediate portion on the meter plate 161 which crosses the slot 151 and swings the forward end of the meter plate out of the track against the force of the spring 163. The transistor below the one just operated upon in this station is therefore free to fall to a position below the meter plate 161. The meter plate 161 swings back before the grippers and straightening punches are separated from the transistor can and the transistor leads, so that the transistor just operated upon drops onto the meter plate.

The straightening and cutoff station is illustrated in greater detail in FIGS. 6 to 9. The station is mounted upon the previously mentioned base plate 71 which has at the rear a downwardly depending lug or attachment 165 on which is mounted an air cylinder 167. The shaft 169 of the air cylinder extends forwardly and is fastened to a downwardly extending lug on a slide plate 171. The slide plate 171 is mounted for limiting sliding forward and rearward motion approximately parallel to the base plate 71, and to this end has its side edges engaged in guides in a pair of guide bars 173 and 175 secured to the base plate 71. A cross bar 177 is secured to the front of the slide plate 171 for movement therewith. Centrally of the cross bar 177 is a bore through which a plunger 179 extends, the plunger extending forwardly into a bore in a punch guide block 181 which is secured to the underside of the base plate 71. The plunger 179 is urged forwardly of the cross bar 177 by a spring 182. Upon movement of the shaft 169, the slide plate 171 and the cross bar 177 likewise travel forwardly and the tip of the plunger 179 enters a rectangular cavity in the punch guide block 181 which serves as a portion of the vertical track in the straightening and cutoff section, being partially covered at the front by a pair of cover plates 183. Consequently upon initial movement of the slide plate 171 and its associated parts forwardly, the tip of the plunger 179 engages the rear of the transistor can and forces the base or header against the cover plates 183, and thereafter the spring 182 compresses to the extent necessary so that there is no further forward motion of the plunger 179 even though the slide plate 171 has not reached its extreme forward limiting position.

At either end of the cross bar 177 are pivoted a pair of forwardly extending bearing slides 185 and 187. The bearing slide 185 has a bearing 189 rotatably mounted near its inner forward edge, while the bearing slide 187 has a similar bearing 191. The outer longitudinal edges of the bearing slides 185 and 187 slide on a pair of rollers 193 as the cross bar 177 moves forwardly. For the purposes of adjustment, each roller 193 is mounted on an arm 195 which is pivoted on a stationary block 197 secured to the under surface of the base plate 71. A set screw 199 extends laterally through the front end of the block 197 to engage a side of the arm 195 to result in a lateral adjustment of the roller 193.

At the front of the punch guide block 181 is a laterally extending recess which opens forwardly and is partially closed over by two cover plates 201 and 203. Slidably mounted within this recess in sets to slide upon respective members of each set are two gripper bars 205 and 207, two straightening punches 209 and 211, and one shear punch bar 213. The straightening punches 209 and 211 each have a rearwardly extending leg having a slanting cam edge 215 which is in engagement with one of the rollers 189 and 191. Due to this arrangement the punches 209 and 211 are cammed toward one another when the rollers 189 and 191 move forwardly due to the forward motion of the slide plate 171 and its associated parts.

The grippers 205 and 207 have opposing arcuate ends which are adapted to grasp the rounded transistor can 49 from opposite sides as the grippers close. Each of the grippers is actuated by a spring plunger 217 which extends outwardly into engagement with the leg of its respective straightening punch 209 or 211, and is actuated during the initial portion of the movement of the rollers 189 and 191 forwardly. Thus the grippers 205 and 207 move toward each other to closed position to grasp the transistor can just before or about the same time that the straightening punches 209 and 211 are moved to closed position.

Figure 7:
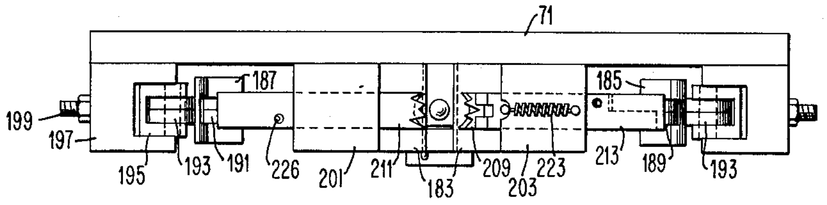
FIG. 7 is a front end view of the station shown in FIG. 6, the mechanism being shown in open position.
Figures 9, 10:
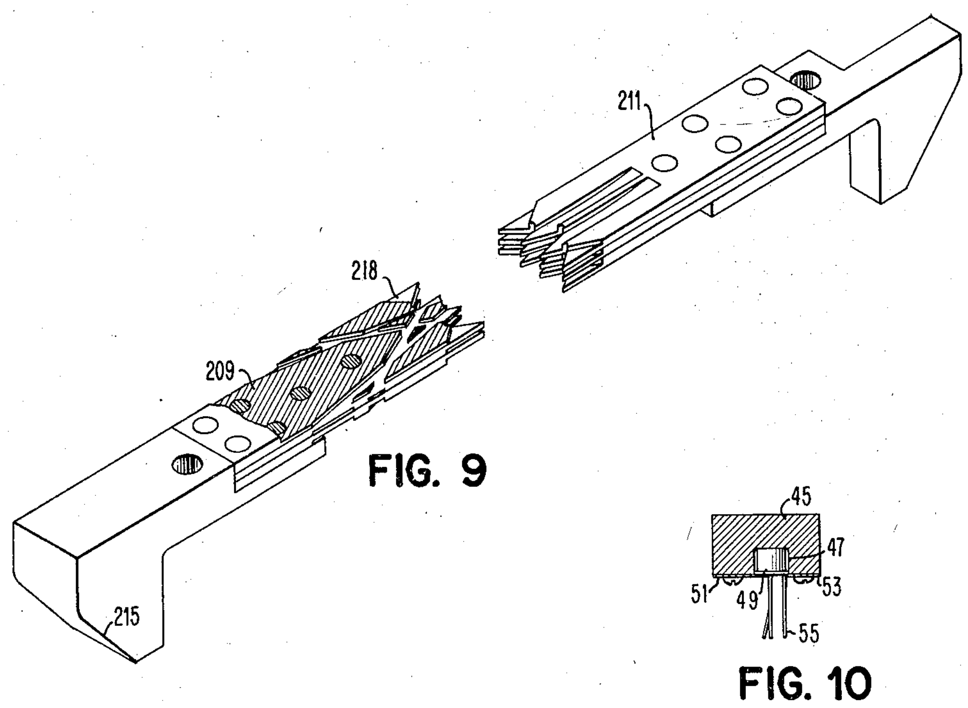
FIG. 9 is a perspective view of the lead straightening punches of the straightening and cutoff station illustrated in FIGS. 6 and 7.
FIG. 10 is a cross-section of the track taken on line 10—10 of FIG. 1 with a transistor received in the track.

As seen in FIGS. 7 and 9, the straightening punches 209 and 211 have W-shaped ends comprising three V-shaped notches into which the lead wires 55 of the transistor being operated upon are gathered. In order to assure good straightening action despite various small kinks in the lead wires, each punch is made up of three layers of superimposed plates, each of the layers being relieved in parts as at 218 so that the points of the punches may overlap and intermesh with each other. The clearance aperture provided between the closed punches by the pairs of V-shaped notches in each of the punches coming together is approximately the same size as the transistor lead 55. Thus the leads are tightly engaged over the width of the straightening punches to straighten the leads approximately perpendicular to the base of the transistor can.

The shear bar or punch 213 at one side only of the station has a rearwardly extending leg with a slanting cam edge 219 which lies inwardly of the corresponding cam edge 215 on the straightening punch 209. Consequently as the roller 189 advances forwardly, the straightening punch 209 is cammed inwardly first, then the cam edge 219 is engaged and the shear bar 213 is cammed inwardly after a short delay. A spring 223 extends between the cover plate 203 and the shear bar 213 to retard the closing movement of the shear bar and assure that the straightening punches are closed before the leads are trimmed to length. The central portion of the cutting edge 221 of the shear punch 213 (FIG. 7) is recessed inwardly so that all three of the transistor leads are cut at approximately the same time. As the rollers 189 and 191 are retracted, they each engage one leg of a pair of bell crank flippers 225 pivoted to the side edges of the punch guide block 181. The other legs of the flippers 225 engage the rearwardly extending portions of the straightening punches 209 and 211, urging them laterally to an open position while at the same time carrying along the grippers 205 and 207 for outward movement to their open position by pins 226 mounted in each of the straightening punches and extending into its respective gripper bar.

A rotary escapement 227 (FIGS. 6 and 8) is mounted at the bottom of the straightening and cutoff station partially overlapping the vertical track. The escapement has two lips 229 and 231 extending out from a main body section. The escapement further has a rearwardly extending actuating rod 233 which passes through a bore in the cross bar 177 and is held in place by a friction block or the like 234. The bottom of the escapement has an arcuate recess 235 the sides of which are engageable by an externally mounted stop rod 237 whereby as the cross bar 177 moves forward and backward, the rotary escapement 227 is rotated by the rod 233 within the limits of engagement with the stop rod 237. Assuming that a transistor has just been operated on, upon the backward movement of the cross bar 177, the rod 233 rotates the escapement and lip 229 moves out of the track enabling the transistor to drop and come to rest on lip 231. The next transistor above drops down into engagement with the newly finished transistor. On the return forward movement of the cross bar 177 the rod 233 rotates the escapement moving lip 229 between the two transistors and raises the transistor to be worked on into position to be grasped by the grippers 205 and 207. While the escapement is rotating the lip 231 moves out of the track and enables the previously completed transistor to drop into the lower track section 75. The escapement rotates until the stop pin 237 engages the edge of the recess 235, rod 233 sliding back through the bore in the cross bar 177 if necessary.

As part of the switching arrangement to assure automatic operation of the straightening and cutoff station, a T bar 239 is secured to the under surface of the slide plate 171 and extends outwardly beyond the edge of the base plate 71. A pair of microswitches S2 and S4 are mounted on the edge of the base plate 71 with their actuating arms in the path of the movement of the bar 239. The microswitches are appropriately connected with the air supply for the air cylinder 167.

As was previously mentioned, the finished transistors with the leads straightened and trimmed to a desired length drop from the lower track section 75 into the empty magazine holder 81. The automatic indexing mechanism 87 for the empty magazine holder is illustrated in greater detail in FIG. 11, wherein is shown the upper disc 31′ mounted on the shaft 25′ having peripheral notches 35′ in which are mounted removably the magazine holders 37′. Briefly the indexing mechanism includes an air cylinder 239 secured at one end to the vertical support 21. There is secured to the shaft 241 of the air cylinder a clevis 243 to which is pivoted a ratchet dog 245. The clevis 243 is also pivoted to the end of a crank 247 mounted for rotation on the shaft 25′. The dog 245 is engageable in the peripheral notches in a ratchet wheel 249, being held in engagement by a spring 251. In the usual manner of operation, the ratchet wheel 249 is advanced by one notch when the air cylinder 239 is energized and de-energized. A microswitch S6 may be conveniently mounted on the brace 83 and is normally closed by the crank 247 except when the air cylinder 239 has been energized and the indexing mechanism is in operation. A detent wheel 253 is mounted concentric with the ratchet wheel 249 and has peripheral V-shaped notches, one for each of the magazine holders, which are engaged by a roller 255 on the end of a swingable arm 257. The arm 257 may be conveniently pivoted on the brace 83 and is constantly urged into contact with the ratchet wheel 253 by a spring 259. Due to the two point contact of the roller 255 with the V-shaped notches in the detent wheel 253, the magazine holder 37′ is moved into alignment with the lower track section 75 at the completion of the indexing movement. A microswitch S5 may be mounted on the brace 83 and is normally closed by the arm 257 except when the mechanism is indexing.

Figure 12:
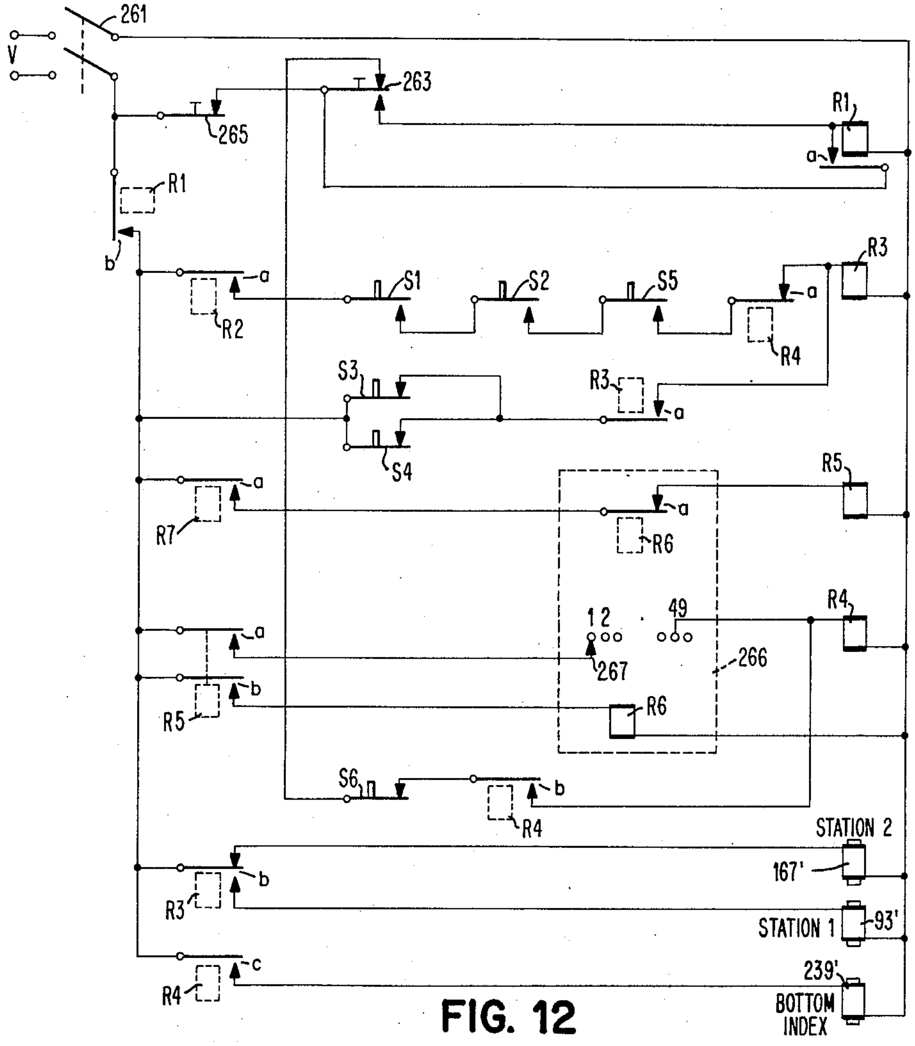
FIGS. 12 and 13 are diagrams of the electrical circuit of the transistor preparation machine.
Figure 13:
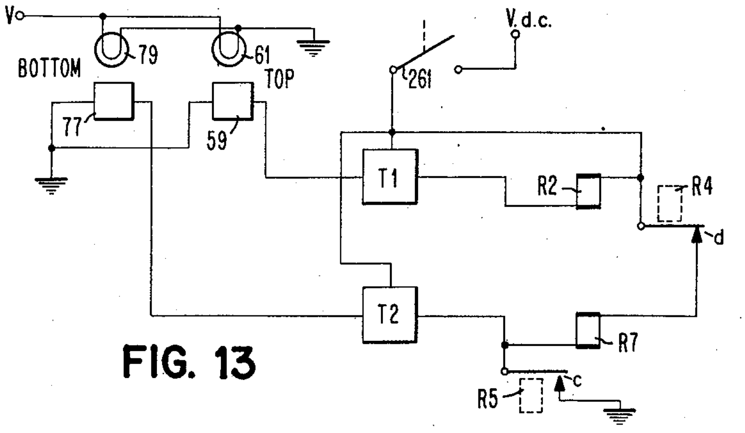

The electrical circuit diagrammed in FIGS. 12 and 13 provides for alternate automatic operation of the pre-straightening station 63 and the straightening and cutoff station 69. In addition the machine is stopped whenever the level of supply transistors to be operated upon in the upper track section 45 falls below the level of the photocell 59, and a circuit is provided for counting off the transistors passing the lower photocell 77 to be delivered to the empty magazine 37′ and to initiate indexing of the magazine holder 81 to place a new magazine below the lower track section 75 when a predetermined number of transistors have filled up a magazine. In the diagram the previously mentioned microswitches S1 and S6 are identified as well as the solenoids for controlling the air cylinders 167, 93 and 239, the solenoids being identified here by corresponding primed numerals. Various relays are identified as R1 to R7. The top photocell 59 is connected to a transistor amplifying circuit identified as T1, while the bottom photocell 57 is connected to transistor amplifying circuit T2. In the preferred embodiment, the empty magazines 37′ are assumed to hold 50 transistors, although obviously they may be made of various other lengths.

The master switch 261 is electrically coupled with the manually operated start push button 263 and the stop push button 265, and is also coupled with the transistor amplifying circuits T1 and T2, and supplies voltage to both circuits when closed. Depressing the start button 263 energizes relay R1 to hold closed both contacts R1*a* and R1*b*. Assuming that there are transistors resting on the meter plate 161 of the pre-straightening section and extending up the upper track section to at least above the level of the top photocell 59, the relay R2 is energized and the contact R2*a* closes. To begin the operation of a machine, the pre-straightening station 63 will be in open position with the microswitch S1 biased closed and the switch S3 in its normal closed condition. The straightening and cutoff station is initially in the closed position (contact R1*b* is closed to supply power through R3*b* to solenoid 167′) with the microswitch S2 biased closed and the switch S4 normally closed. Since the indexing mechanism 87 for the empty magazine holder is at rest, the microswitches S5 and S6 are closed, S5 being biased closed whereas S6 is normally closed. A circuit is completed through the *a* contact of R2, S1, S2, S5 and the *a* contact of relay R4 which is normally closed, to relay R3. Relay R3 is thus energized, moving the *b* contact of relay R3 to the back contact position energizing solenoid 93′ to extend the air cylinder 93 and initiate movements of the pre-straightening station to closed position. At the same time the solenoid 167′ is de-energized and the *a* contact of relay R3 is closed.

As the shaft 95 of the pre-straightening station moves forwardly the switch S1 is opened breaking the circuit to relay R3. However, relay R3 is held in by its closed R3*a* contact which has a circuit through the normally closed switches S3 and S4. Switch S3 remains closed during the travel of the air cylinder 93 while the straightening and cutoff station has begun to move to open position and consequently S2 is open and S4 is closed during the travel of air cylinder 167. At the forward portion of the movement of shaft 95, the switch S3 is moved to open position while switch S4 is likewise opened by retraction of the shaft 169, thereby de-energizing relay R3 and moving the R3*b* contact to the front contact position wherein the solenoid 93′ is de-energized and the solenoid 167′ of the straightening and cutoff station is now energized. The air cylinder 167 extends and at the forward limit of its motion restores the original condition wherein switch S2 is closed as is now the other switch S1 on the pre-straightening station (S3 and S4 also reclose). Thus relay R3 is again energized moving the R3*b* contact to the position de-energizing the solenoid 167' and energizing the solenoid 93' of the pre-straightening station.

In the event that there is a stoppage in the supply of transistors into the upper track section 45, the lamp 61 energizes the top photocell 59 thereby de-energizing relay R2 and opening the R2*a* contact so that the pre-straightening station does not operate on the next cycle. Consequently the normal sequence of alternate operation of the two stations is broken and the machine stops.

To count transistors dropping into the lower track section 75, it will be noted that as each transistor passes between the lamp 79 and the bottom photocell 77, the circuit to the transistor amplifying circuit T2 is broken thereby causing T2 to conduct. The circuit T2 has a thyratron type operation which energizes relay R7, thereby closing the R7*a* contact and producing a circuit to relay R5 through the normally closed *a* contact of relay R6 (a self-interrupted type). Both the *a* and *b* contacts of relay R5 are closed, energizing relay R6 on a counting device 266 and moving open the R6*a* contact of this relay. As a result the relay R5 is de-energized. During the time that relay R5 is energized, the R5*c* contact coupled to relay R7 is closed and the relay R7 is held on even though thyratron circuit T2 is turned off, by shorting the collector of T2 to ground.

The counting device 266 has a series of contacts numbered 1 to 50, and a mechanical device actuated by relay R6 steps a movable contact 267 coupled with the *a* contact of relay R5 from one of the numbered contacts to the next consecutive numbered contacts. As the contact 267 moves from the 48th numbered contact to the 49th numbered contact, it will be observed that a circuit is completed to relay R4 the next time a transistor, i.e. the 50th, comes through and closes relay R5 to be energized.

At this time the *a* contacts of relay R4 are opened whereas the *b*, *c*, and *d* contacts of R4 are closed. The closing of the *c* contact energizes the solenoid 239' of the air cylinder 239 of the bottom indexing mechanism 87, causing the empty magazine holder 81 to be indexed by one position. At the forward limit of travel of the air cylinder 239, the microswitch S5 is opened and the operation of the first or pre-straightening station is prevented. The *b* contact of relay R4 holds on this relay (through S6) even though the moving contact 267 has jumped from the 49th numbered position to the 50th numbered position, breaking the connection of contact 267 to R4. Upon the completion of the bottom indexing movement of the empty magazine holder 81, the switches S5 and S6 are again closed and the machine is set up for the operation of the pre-straightening station. A mechanical device not here shown returns the movable contact 267 to the 1 position ready to start counting for the new magazine 37' which is now in place.

In the review of the operation of the transistor preparation machine which follows the electrical circuitry will not be discussed in as much detail as in the preceding paragraphs. It will be recalled that the general operation of the machine is that the transistors 41 as received from the manufacturer are loaded into supply magazines 37 (FIG. 1) and inserted into aligned peripheral notches 35 in the discs 31 and 33 of the supply and storage device 23. The device 23 is rotated manually to align a particular one of the loaded magazines 37 with the upper track section 45. Once the machine has been started, the transistors 41 slide down the track 45 into the pre-straightening station 63 where each transistor is properly located and the three leads of the transistor are engaged loosely by opposing W-punches and combed forwardly a short distance to provide a pre-straightening action. The pre-straightened transistors drop down the intermediate track section 67 into the final straightening and cutoff station 69. In this station the transistors are properly located and given a more accurate straightening action by another set of overlapping W-punches. The straightening action is approximately perpendicular to the base or header of the transistor can. Then a shear punch is actuated to trim the leads of the transistor to length. The transistors drop through the lower track section 75 into the empty magazines 37' of the empty magazine holder 81.

Figure 2:
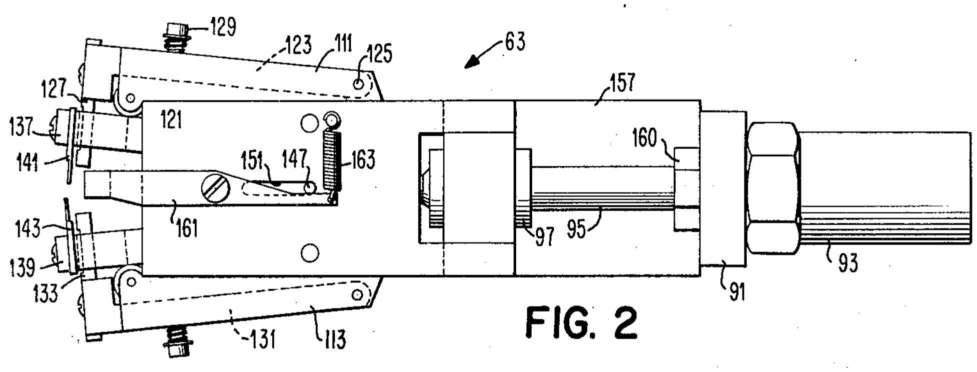
FIG. 2 is a plan view of the pre-straightening station looking upwardly from the bottom of the machine, the mechanism being shown in open position.
Figure 3:
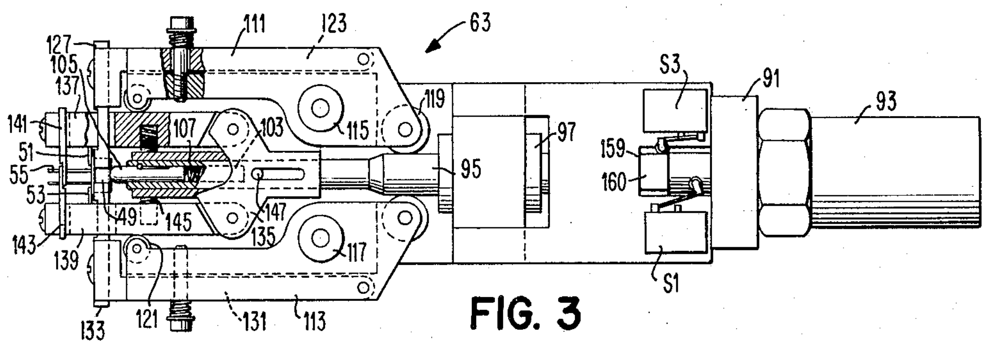
FIG. 3 is a plan view similar to FIG. 2 with a bottom plate removed to reveal the interior, parts being shown in section and the mechanism being in closed position.
Figure 4:
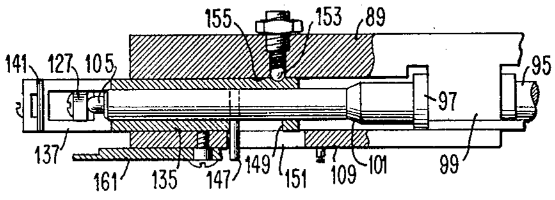
FIG. 4 is a cross-sectional view of the front portion only of the pre-straightening station taken longitudinally of FIG. 3 approximately on the center line, the straightening punches being shown moved forward.

To initially start the machine it is desirable that the straightening and cutoff station 69 be pre-loaded with two transistors. This may be accomplished by operating the pre-straightening station 63 through two manual cycles, or by loading the machine with a few transistors which have already been straightened and cut off. Upon pressing the start push button 263 to initiate automatic cycling of the machine, the pre-straightening station 63 is in its open position whereas the straightening and cutoff station 69 is in its closed position. A transistor is located within the portion of the vertical track 45 within the pre-straightening station resting on the meter plate 161 (FIG. 2). It is the transistor immediately above this one which is to be operated upon by the pre-straightening station. Upon energization of the air cylinder 93, referring to FIGS. 2 to 5, the cam shaft 95 extends forwardly until the tip of the plunger 105 engages the rear of the transistor can and urges the header of the can against the track cover plates 51 and 53, the plunger retracting slightly if necessary against the force of the spring 107. As the cam surface 101 on the shaft 95 engages the rollers 119 on a pair of opposing cam levers 111 and 113, pivoted respectively at 115 and 117, the foward ends carrying the grippers 127 and 133 move laterally towards one another until gripping the opposing sides of the transistor can 49. The transistor can 49 is thus held squarely against the track cover plates 51 and 53 by the plunger 105 while being confined from either side by the grippers 127 and 133.

As the grippers come together, a pair of W-punches 141 and 143 for pre-straightening the leads of the transistor are also cammed together by the rolls 121 which engage the blade arms 137 and 139 on which the straightening punches are fastened. The blade arms 137 and 139 are pivoted on a yoke 135 through which the cam shaft 95 extends and which has limited sliding movement in a front to rear direction between two positions defined by the engagement of a detent 153 in notches 155 in the yoke member. The yoke 135 in initially in its rearmost position, and when the downwardly projecting pin 147 on the shaft 95 comes to the end of the slot 149 in the bottom of the yoke member, the yoke 135 is pushed forward a short distance overcoming the detent 153. The W-punches 141 and 143 are together in overlapping relation and form three cavities to confine each of the transistor leads 55 but allowing some clearance. When the detent 153 is overcome by the advancing cam shaft 95, the blade arms and the pre-straightening punches 141 and 143 are moved forwardly a short distance rolling on the bearings 121 to thereby comb the leads forwardly to pre-straighten them within the range of the straightening and cutoff station. In the extreme forward position of the cam shaft 95 the pin 147 engages the meter plate 161 and swings it aside against the force of the spring 163. Thus the transistor below the one which has just been pre-straightened is free to drop into the intermediate track section 67.

Upon retraction of the cam shaft 95 by the air cylinder 93 the rollers 119 roll down the cam surface 101 and the grippers 127 and 133 and the W-punches 141 and 143 are free to separate to open position under the force of the springs 145. When the pin 147 engages the rear of the slot 149 in the bottom of the yoke 135, the yoke 135 is retracted against the force of the detent 153. The pre-straightening station is thus returned to its initial open position ready to operate upon the next transistor. The meter plate 161 in the meantime has been biased back into blocking engagement with the transistor just pre-straightened.

Referring to FIGS. 6 to 9, the transistor released by a swinging meter plate 161 of the pre-straightening station drops through the intermediate track section 67 into the straightening and cutoff station 69 where it strikes the transister load into the rotary escapement 227 and is engaged and rests on the lip 229 of the rotary escapement as the escapement rotates back to its initial position. The straightening and cutoff station 69 operates alternately with the pre-straightening station 63. Upon the energization of the air cylinder 167 the shaft 169 extends forwardly carrying with it the slide plate 171 and the cross bar 177. The plunger 179 carried by the cross bar moves forwardly through its bore in the punch guide block 181 until its tip strikes the rear of the can of the transistor and urges the header of the can against the track cover plate 183. If necessary the plunger 179 retracts slightly against the force of the spring 182.

As the cross bar 177 moves forwardly, the bearing slides 185 and 187 at either side slide along the rollers 193, and the bearings 189 and 191 on the slides 185 and 187 roll along cam surfaces 215 on the rearwardly projecting portions of a pair of straightening punches 209 and 211, urging them inwardly toward one another. Upon the initial inward movement of these punches toward one another, spring lungers 217 on the pair of gripper bars 205 and 207 are actuated and move the grippers inwardly to engage the sides of the transistor can. At this time the transistor can is located gainst the track cover plates 183 by the plunger 179 and are confined from opposing sides by the grippers 205 and 207. The continuing inward movement of the straightening punches 209 and 211 moves them into overlapping engagement, each of the punches having three layers which intermesh to provide a good straightening action smoothing out any small kinks in the transistor leads. The three points of clearance between the interengaged punches 209 and 211 in which the transistor leads are received have dimensions such that the punches confine the leads tightly without damaging them. Shortly after engaging the cam edge 215, the bearing 189 engages the cam edge 219 on a rearwardly projecting portion of the shear punch 213, camming the shear punch inwardly to cut off the three leads to the predetermined desired length.

Upon the retraction of the shaft 169, the bearings 189 and 191 move rearwardly and the shear punch 213 is retracted outwardly to its initial open position by the spring 223. The bearings 189 and 191 engage the bell crank flippers 225 which press outwardly at their other ends on the rearwardly projecting legs of the straightening punches 209 and 211, thereby retracting them to open position, and carrying along the grippers 205 and 207. The plunger 179 is at the same time retracted to release the transistor can to slide down the rotary escapement 227 to rest upon the lip 231. The same transistor is released by the rotary escapement 227 upon the initial portion of the forward movement of shaft 169 and drops in the lower track section 75 into the empty magazine 37' on the empty magazine holder 81. Although not here shown, a jet of air or other suitable arrangement may be provided for breaking the velocity of the fall of the transistor through the magazine 37' to prevent damage to the transistor. The falling of the transistor past the photocell 77 actuates a counting circuit as previously described to stop the machine when the magazine 37' is filled and it is necessary to rotate the empty magazine holder 81 by the indexing mechanism 87 in the manner previously described.

If desired an automatic indexing mechanism similar to mechanism 87 may be provided for the loading and storage device 23 operating in much the same manner. It may be noted that the machine may operate on transistors continuously and automatically unless stopped by providing the manually rotated magazine holder 23 and by disconnecting the automatic indexing mechanism 87 and removing the empty magazine holder 81 and replacing it by a simple box into which the finished straightened and trimmed transistors drop out of the lower track section 75. In this manner the machine straightens and cuts off the leads of transistors continuously without stoppage at the average rate of 150 per minute, and the rate may reach as high as 300 per minute.

The cross section of the magazine 37 is such that the transistors are oriented to the same position for the straightening operation. It is only necessary upon loading the magazine to be sure that two of the leads of the transistor are against the left hand side of the magazine as shown in FIG. 1. The transistor preparation machine according to the invention adequately provides for gripping the leads 55 without damage while they are straightened approximately perpendicular to the base or header of the can to about within three degrees of the normal and are subsequently trimmed to length. The three leads of each transistor are thus approximately the same distance apart and can be inserted either manually or automatically through previously made holes in a mounting card or the like. The machine straightens the leads and trims them to length without causing substantial damage either to the leads or to the transistor can.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A machine for straightening and trimming the leads of an electrical component of the type having a plurality of leads projecting from one end of a body member, said machine comprising a first pre-straightening station and a second straightening and cut-off station, track means adapted to receive a supply of the components for movement therealong and including portions extending through said stations, said first station being movable between open and closed positions and comprising means for gripping the sides of the body member of the component and locating the one end of the body member against a portion of said track means during movement of said first station to said closed position, said first station further including means for loosely encircling each lead and for combing the leads forwardly in a direction approximately perpendicular to the one end of the body member, the component being released for movement toward said second station upon retraction of said first station to its open position, said second station being movable between open and closed positions and comprising means for gripping the sides of the body member and locating the one end of the body member against a portion of said track means when said second station is in said closed position, means mounted for lateral movement toward each other into interengagement for confining and tightly engaging each lead to straighten each such lead approximately parallel to one another and perpendicular to the one end of the body member, and means for shearing the leads to the desired length, the component being released upon movement of said second station to said open position.

2. A construction as defined in claim 1 further including a single power means for each of said stations, and means for alternately energizing each of said power means to cause alternate movement of said stations to their respective closed positions.

3. A transistor preparation machine for straightening the leads of the transistor approximately parallel to one another and perpendicular to the base of the can and for trimming the leads to length, the transistor having a plurality of leads projecting from the base of the can, said machine comprising a first pre-straightening station and a second straightening and cut-off station each movable between open and closed positions, vertically disposed track means adapted to receive a supply of the transistors for gravity feed through the stations, stop means at each of said stations movable into and out of blocking engagement with the transistors, said pre-straightening station including means for gripping the transistor can from opposite sides and for holding the base of the can against a portion of said track means, and means for thereafter loosely encircling each of the leads and for combing the leads forwardly in a direction approximately perpendicular to the base of the can, said second station including means for gripping the transistor can from opposite sides and for holding the base of the can against a portion of said track means, laterally movable means for thereafter confining and simultaneously tightly engaging every portion of each of the combed pre-straightened leads to straighten said leads approximately parallel to one another and perpendicular to the base of the can, means for subsequently shearing the leads to length, and a single power means for each of the stations, the power means for the two stations being energized alternately to move the two stations alternately to their respective closed positions.

4. A machine for straightening and trimming the leads of components of the type having a plurality of leads projecting from one end of a body member, said machine comprising a first pre-straightening station and a second straightening and cut-off station each movable between open and closed positions, track means adapted to recieve a supply of the components for movement therealong and including portions extending through said stations, said track means including a channel in which the body member is received and a pair of cover plates secured to the open side of said channel between which the leads extend, said first station including a shaft having a spring biased plunger at its end, power means for advancing said shaft to engage said plunger with said component body member and urge said body mem- against said track cover plates, a pair of grippers cammed toward one another by said advancing shaft to engage the body member from opposite sides, a pair of punches coupled for movement with said grippers into ovelapping engagement loosely confining each of said leads, said punches being engaged and carried forward during the final portion of the forward movement of said shaft to comb the leads for a short distance, the retraction of said shaft likewise retracting said punches, grippers and plunger to release the component for movement to said second station, said second station comprising means for gripping the body member from either side and for urging the body member against said track cover plates, punch means for movement into overlapping position tightly confining each lead to straighten each such lead approximately perpendicular to the one end of the body member, and means for shearing the leads to the desired length.

5. A construction as defined in claim 4 wherein said shaft has a cam surface, and wherein each of said grippers is secured to a cam lever having rollers sliding on said cam shaft, said first mentioned punches being secured to arms each having a pivotal connection with a yoke member through which said cam shaft extends, said arms being biased into engagement with rollers on said cam levers by a pair of springs reacting against said yoke member.

6. A construction as defined in claim 5 further including a stop plate pivoted for movement into and out of blocking engagement with the component body members in said channel of said track means, and a pin on said cam shaft extending downwardly through a slot in said yoke member to be engageable with said stop plate during the forward portion of the movement of said cam shaft.

7. A machine for straightening and trimming the leads of components of the type having a plurality of leads projecting from one end of a body member, said machine comprising a first pre-straightening station and a second straightening and cut-off station each movable between open and closed positions, track means adapted to receive a supply of the components for movement therealong and including portions extending through said stations, said track means including a channel in which the body member is received and a pair of cover plates secured to the open side of the channel between which the leads extend, said first station including means for gripping the body member from either side and for urging the one end of the body member against said track cover plates, and further including means for combing forward the leads for a short distance, said second station including a shaft, a slide connected to said shaft on which is mounted a spring biased plunger, power means for advancing said shaft and slide to engage said plunger with the component body member and urge the one end of the body member against said track cover plates, a pair of grippers cammed toward one another by said advancing slide to engage the body member from opposite sides, a pair of straightening punches cammed toward one another by said advancing slide into overlapping engagement to tightly confine each lead and straighten each such lead approximately perpendicular to the one end of the body member, a shear punch cammed by said advancing slide subsequent to the closing of said straightening punches to trim the leads to length, and spring means and mechanical means for retracting said shear punch and opening said straightening punches and grippers upon the retraction of said shaft, slide and plunger.

8. A construction as defined in claim 7 wherein said track means is disposed vertically to provide a gravity feed of the components, and further including a rotary escapement having portions movable into and out of blocking engagement with the component body members in the channel of said track means, said rotary escapement being operated by a rod fastened releasably to said slide to pass a component upon each reciprocation of said slide and shaft.

9. A machine station for straightening and trimming the leads of a component of the type having a plurality of leads projecting from one end of a body member, said machine including a track adapted to receive a supply of aligned components for movement therealong, said track comprising a channel in which the body member is received and a pair of cover plates secured to the open side of the channel between which the leads extend, power means having a reciprocating shaft, a slide secured to said shaft on which is mounted a spring biased plunger, said plunger engaging the component body member upon forward movement of said slide and shaft to urge the one end thereof against said track cover plates, a pair of straightening punches and a pair of grippers each member of which is slidably mounted for movement toward the other member of its respective pair, said straightening punches having rearwardly disposed cam edges to be engaged by said advancing slide to move said punches to closed position tightly confining each lead and straightening each such lead approximately perpendicular to the one end of the body member and parallel to one another, means for resiliently coupling said grippers with said punches to urge said grippers into closed position engaging the body member from either side prior to movement to fully closed position of said straightening punches, a shear punch mounted for lateral sliding movement by said advancing slide to trim the leads to length subsequent to the closing of said straightening punches and grippers, and spring means and mechanical means for retracting said shear punch and for moving said straightening punches and grippers to open position upon retraction of said slide and shaft.

10. A machine for straightening and trimming the leads of transistors having three leads projecting from the base of the can thereof in a triangular configuration, said machine comprising a first pre-straightening station and a second straightening and cut-off station each movable between open and closed positions, track means adapted to receive an aligned supply of transistors for movement therealong and including portions extending through said stations, said track means including a channel in which the can is received and cover means secured to the open side of the channel forming a longitudinal slot between which the leads project forwardly with two of the leads slidable along one side of the slot and the third lead slidable along the other side of the slot, stop means at each of said stations movable into and out of blocking engagement with the transistors, said first station comprising means for resiliently gripping the sides of the can and resiliently urging the base of the can against said track cover means, means for thereafter loosely encircling and combing each of the leads forwardly over a predetermined length thereof in a direction approximately perpendicular to the base of the can, said second station including means for resiliently gripping the sides of the can and resiliently urging the base of the can against said track cover means, laterally movable interengageable means for thereafter gathering and simultaneously tightly engaging every portion of each of the leads over the combed predetermined length thereof to straighten said predetermined lead lengths approximately parallel to one another and perpendicular to the base of the can, and means for subsequently shearing the leads to length.

11. A machine station for straightening and trimming the leads of transistors each having three leads projecting from the base of the can thereof in a triangular configuration, said machine including vertically disposed track means adapted to receive a supply of aligned transistors for gravity feed through said station, said track means including a channel in which the can is received and cover means secured to the open side of the channel forming a longitudinal slot between which the leads project forwardly with two of the leads slidable along one side of the slot and the third lead slidable along the other side of the slot, power means having a reciprocating shaft movable forwardly and backwardly, stop means movable into and out of blocking engagement with the transistors, means actuated by the forward movement of said shaft for resiliently gripping the transistor can from either side and for resiliently urging the base of the can against said track cover means, thereby gently holding the transistor can in a substantially fixed location within said track means, a pair of W-punches mounted for lateral movement thereafter toward one another into interengagement confining and tightly engaging each of the leads and straightening said leads approximately parallel to one another and perpendicular to the base of the can, a shear punch mounted slidably on one of said W-punches for lateral movement to trim the leads to length, means actuated by the forwardly moving shaft for camming said W-punches into interengagement prior to camming said shear punch laterally to trim the leads, and mechanical means for retracting said W-punches, shear punch and gripping and holding means upon the backward movement of said shaft.

References Cited in the file of this patent

UNITED STATES PATENTS

| | | |
|---|---|---|
| 1,051,497 | Harter | Jan. 28, 1913 |
| 1,760,629 | Brindle | May 27, 1930 |
| 1,853,947 | Van Der Poel et al. | Apr. 12, 1932 |
| 2,120,877 | Uber | June 14, 1938 |
| 2,493,560 | Vasselli | Jan. 3, 1950 |
| 2,964,088 | Erath | Dec. 13, 1960 |
| 2,979,084 | Roeber | Apr. 11, 1961 |
| 2,993,516 | Davison et al. | July 25, 1961 |
| 3,013,590 | Peachy | Dec. 19, 1961 |
| 3,027,921 | Mitchell et al. | Apr. 3, 1962 |
| 3,028,886 | Drukker | Apr. 10, 1962 |

OTHER REFERENCES

Essert, R. D.: "Transistor Lead Straightener," IBM Technical Disclosure Bulletin, August 1959 (volume 2, No. 2).